(12) United States Patent
Kollberg et al.

(10) Patent No.: US 11,702,740 B2
(45) Date of Patent: Jul. 18, 2023

(54) CLOSURE ELEMENT FOR CLOSING A LOADING OPENING OF AN INNER HOUSING OF A CVD REACTOR

(71) Applicant: AIXTRON SE, Herzogenrath (DE)

(72) Inventors: Marcel Kollberg, Würselen (DE); Francisco Ruda Y Witt, Eschweiler (DE); Mike Pfisterer, Würselen (DE)

(73) Assignee: AIXTRON SE, Herzogenrath (DE)

( * ) Notice: Subject to any disclaimer, the term of this patent is extended or adjusted under 35 U.S.C. 154(b) by 376 days.

(21) Appl. No.: 16/652,647

(22) PCT Filed: Oct. 2, 2018

(86) PCT No.: PCT/EP2018/076792
§ 371 (c)(1),
(2) Date: Apr. 22, 2020

(87) PCT Pub. No.: WO2019/068709
PCT Pub. Date: Apr. 11, 2019

(65) Prior Publication Data
US 2020/0318235 A1 Oct. 8, 2020

(30) Foreign Application Priority Data

Oct. 6, 2017 (DE) .................... 10 2017 123 231.1

(51) Int. Cl.
*C23C 16/44* (2006.01)
*H01L 21/67* (2006.01)
(Continued)

(52) U.S. Cl.
CPC ............ *C23C 16/4409* (2013.01); *F16K 3/18* (2013.01); *F16K 3/314* (2013.01); *H01L 21/6719* (2013.01); *H01L 21/67126* (2013.01)

(58) Field of Classification Search
CPC ........... C23C 16/4409; H01L 21/67376; H01J 37/18; F16K 3/18; F16K 3/20; F16K 3/314
See application file for complete search history.

(56) References Cited

U.S. PATENT DOCUMENTS

| 6,273,664 B1 | 8/2001 | Doche | |
|---|---|---|---|
| 2006/0054854 A1* | 3/2006 | Tauchi | ............. H01L 21/67126 251/326 |

(Continued)

FOREIGN PATENT DOCUMENTS

| DE | 102014106467 A1 | 11/2015 |
|---|---|---|
| DE | 102016101003 A1 | 7/2017 |
| JP | H05 160031 A | 6/1993 |

OTHER PUBLICATIONS

International Preliminary Report on Patentability dated Apr. 8, 2020, from The International Bureau of WIPO, for International Patent Application No. PCT/EP2018/076792 (dated Oct. 2, 2018), 18 pages.

(Continued)

*Primary Examiner* — Parviz Hassanzadeh
*Assistant Examiner* — Nathan K Ford
(74) *Attorney, Agent, or Firm* — Ascenda Law Group, PC

(57) ABSTRACT

A CVD reactor includes a gas-tight and evacuatable reactor housing and an inner housing arranged therein. The inner housing has means for the infeed of a process gas and means for holding a substrate for treatment in the inner housing by means of the process gases. The inner housing also has a loading opening which can be closed off by a sealing element of a closure element. In its closure position, the closure element bears with an encircling sealing zone against a counterpart sealing zone which encircles the loading opening on the outer side of the inner housing. The sealing element is fastened to a carrier as to be adjustable in (Continued)

terms of inclination and/or pivotally movable about at least one spatial axis (X, Y, Z) and/or so as to be elastically deflectable in the direction of one of the spatial axes (X, Y, Z).

9 Claims, 8 Drawing Sheets

(51) Int. Cl.
*F16K 3/18* (2006.01)
*F16K 3/314* (2006.01)

(56) References Cited

U.S. PATENT DOCUMENTS

| | | |
|---|---|---|
| 2010/0300920 A1 | 12/2010 | Wagner et al. |
| 2011/0089354 A1 | 4/2011 | Nagao et al. |
| 2011/0108750 A1* | 5/2011 | Ehrne ............... F16K 51/02 251/319 |
| 2013/0101372 A1 | 4/2013 | Tschinderle et al. |
| 2015/0069282 A1 | 3/2015 | Jee |
| 2018/0156339 A1* | 6/2018 | Kim ................ F16K 3/18 |

OTHER PUBLICATIONS

Written Opinion dated Nov. 22, 2018, from the ISA/European Patent Office, for International Patent Application Mo. PCT/EP2018/076792 (dated Oct. 2, 2018), English translation, 8 pages.

International Search Report and Written Opinion dated Nov. 22, 2018, from the ISA/European Patent Office, for International Patent Application No. PCT/EP2018/076792 (dated Oct. 2, 2018), 14 pages.

International Search Report dated Nov. 22, 2018, from the ISA/European Patent Office, for International Patent Application No. PCT/EP2018/076792 (dated Oct. 2, 2018), English Translation, 3 pages.

* cited by examiner

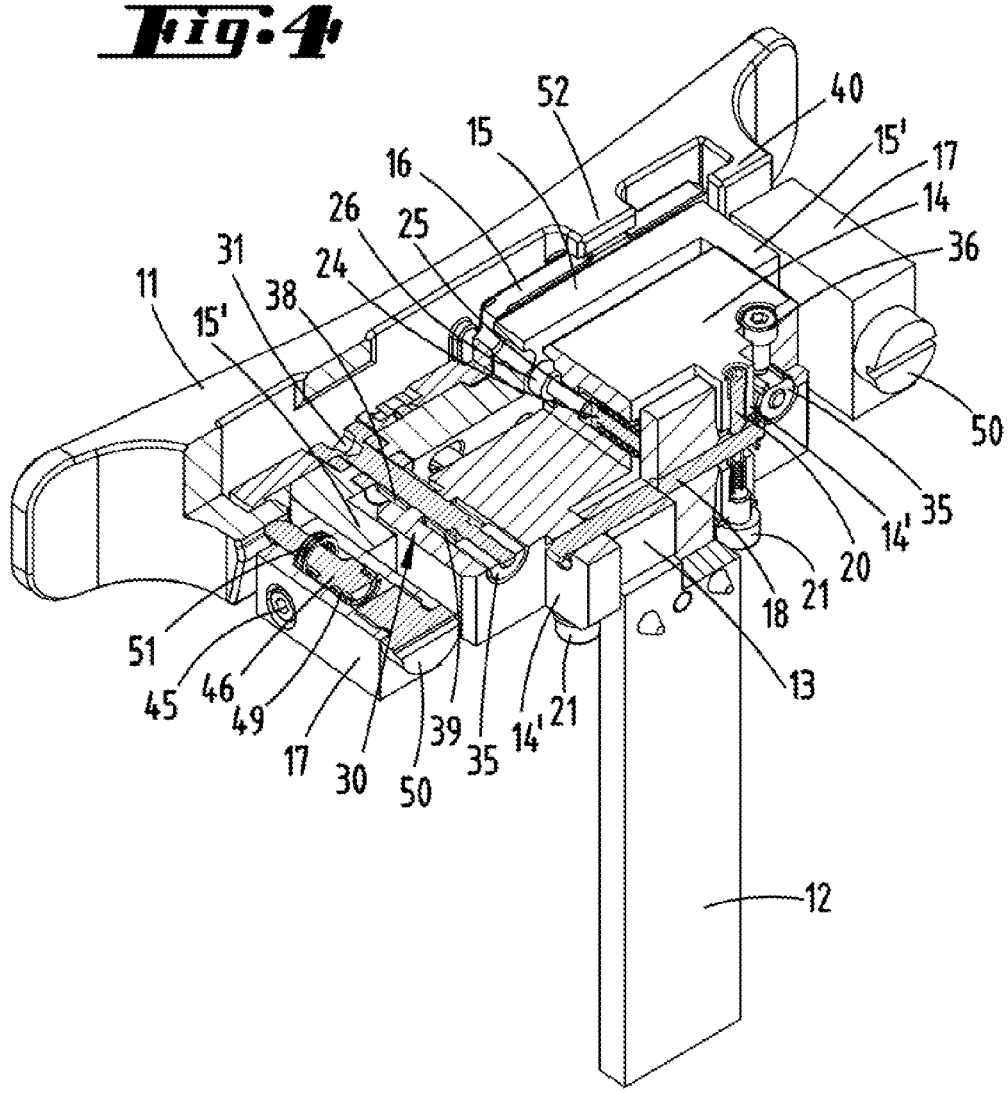

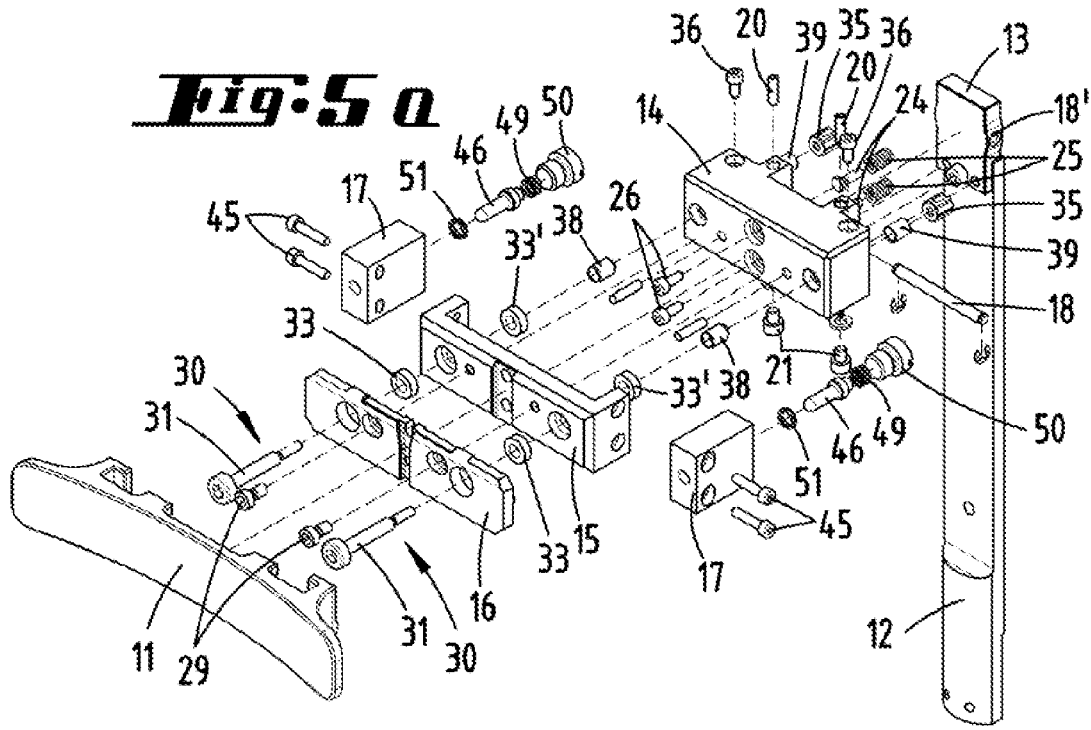
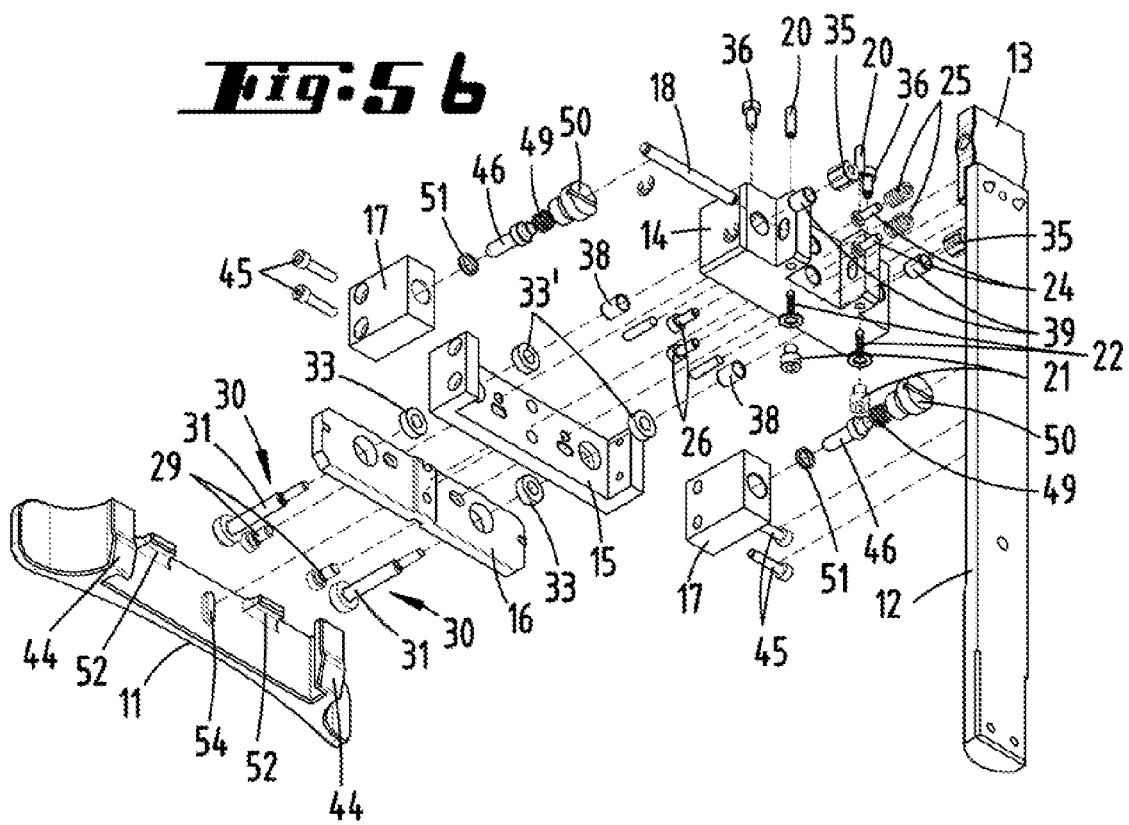

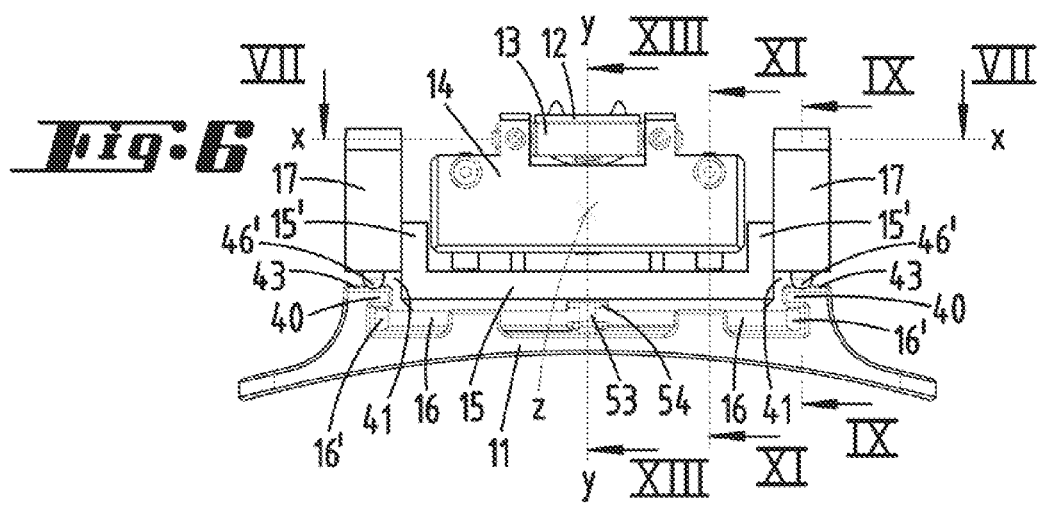
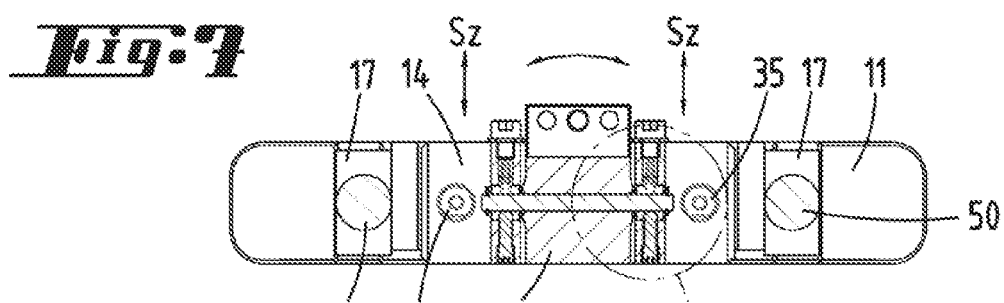
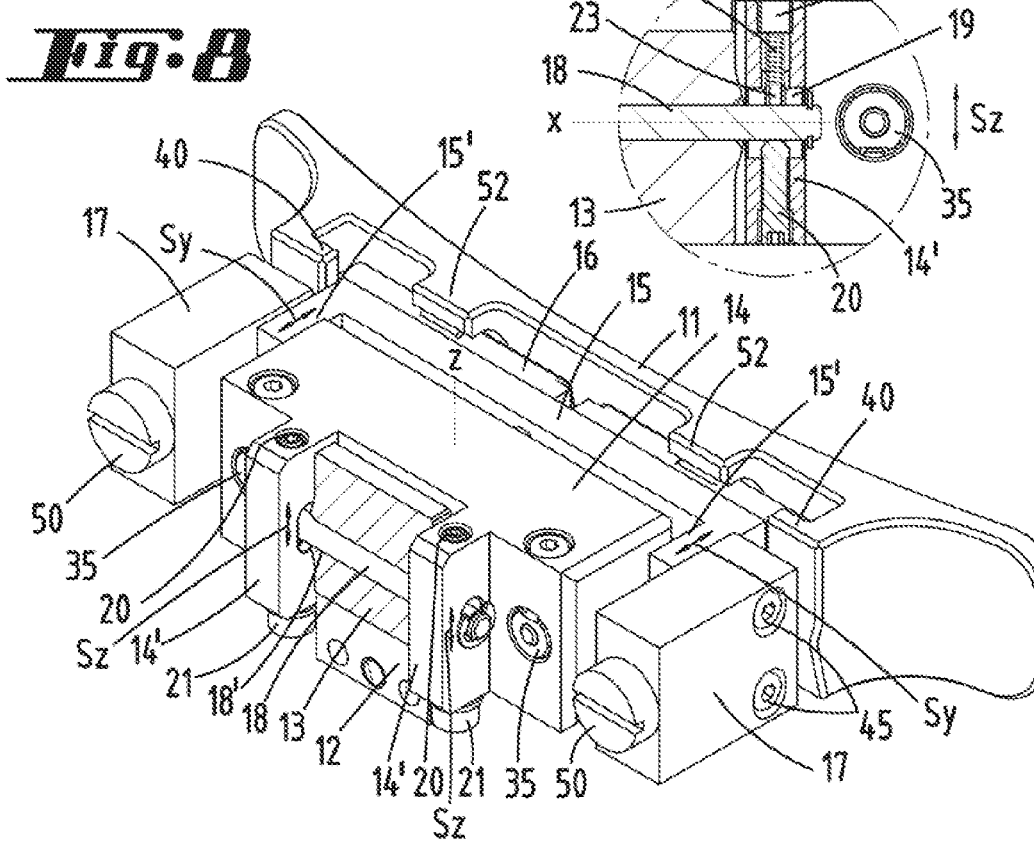

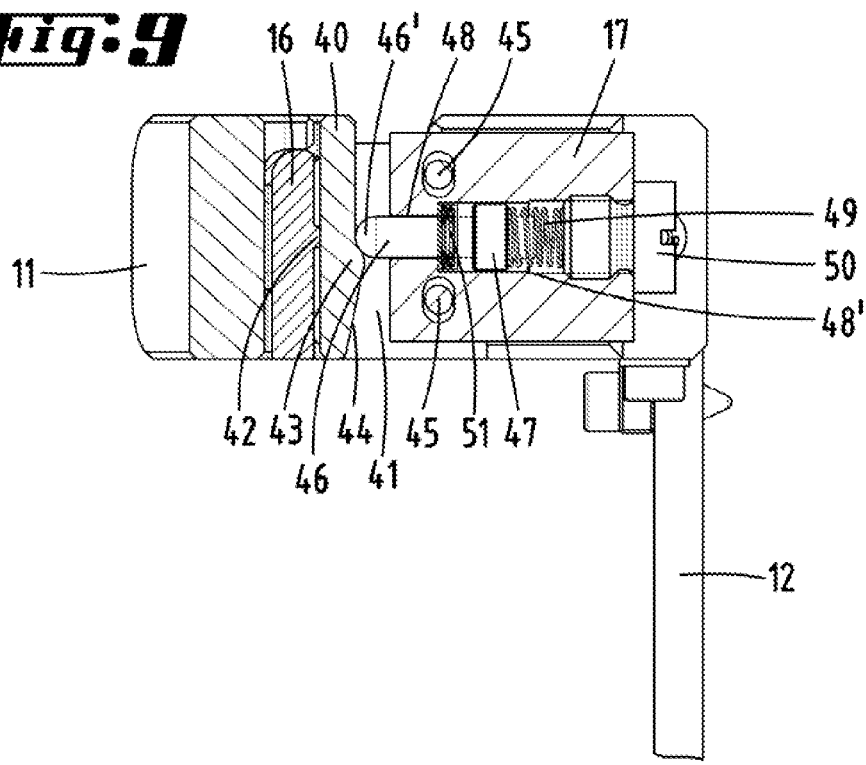
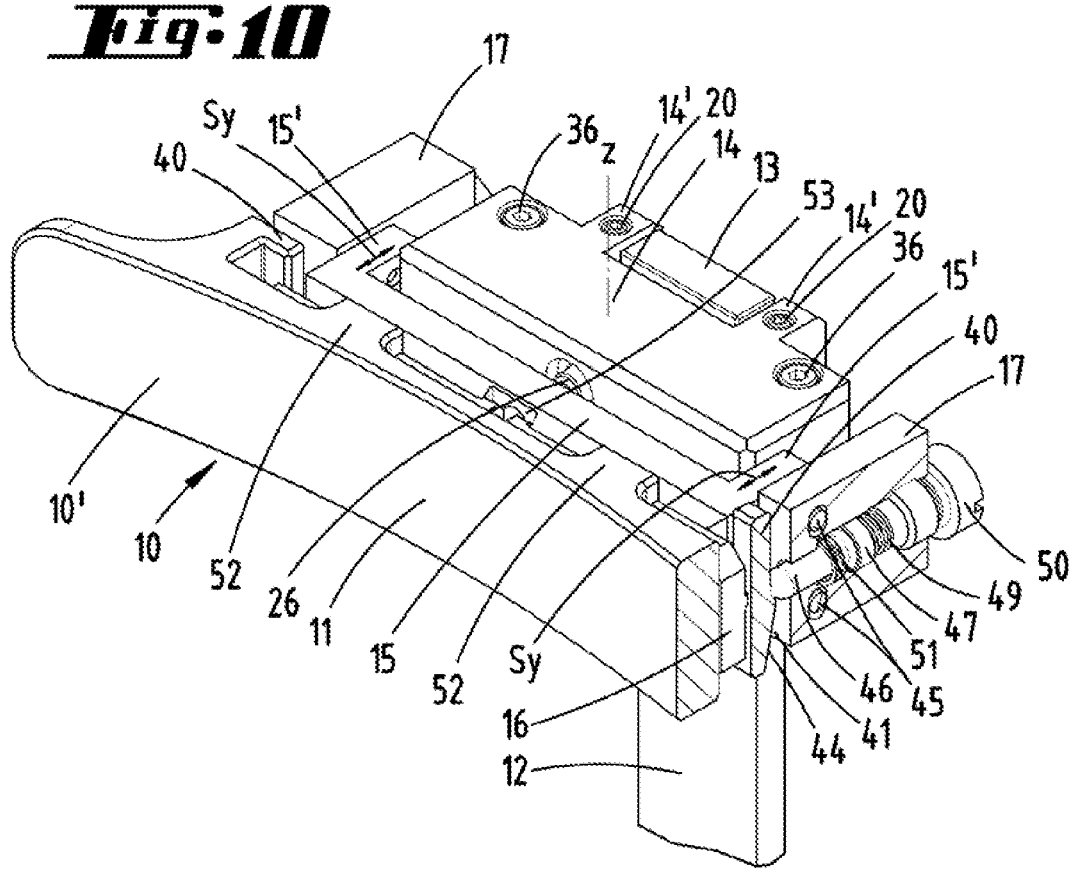

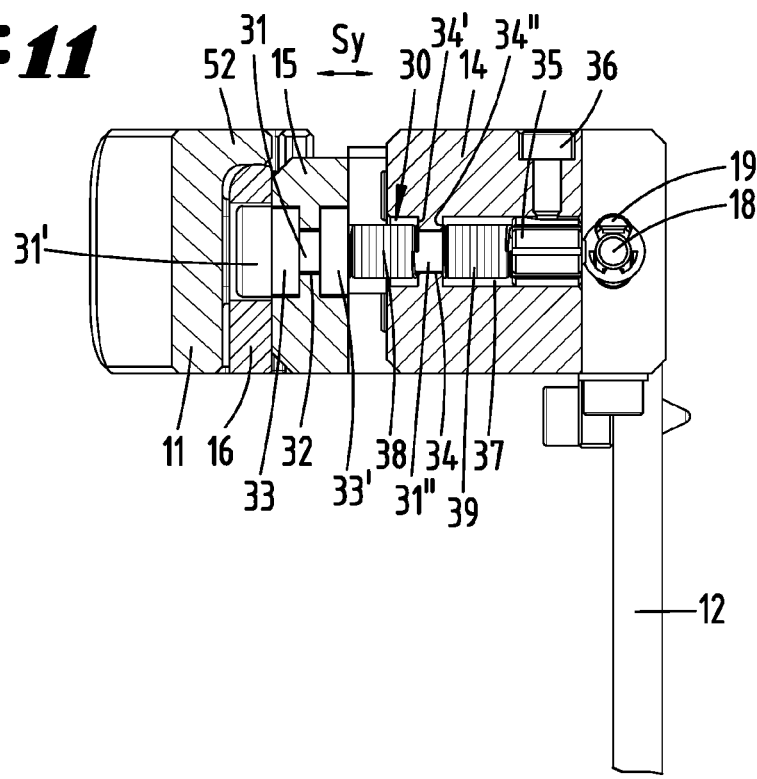
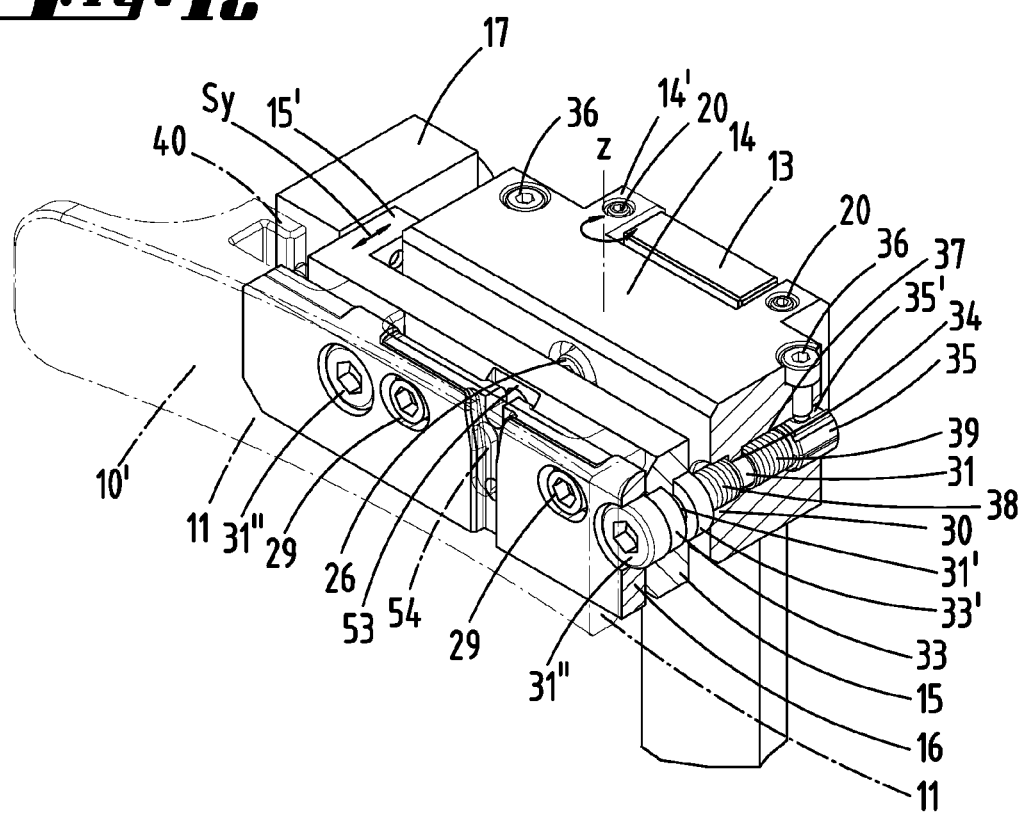

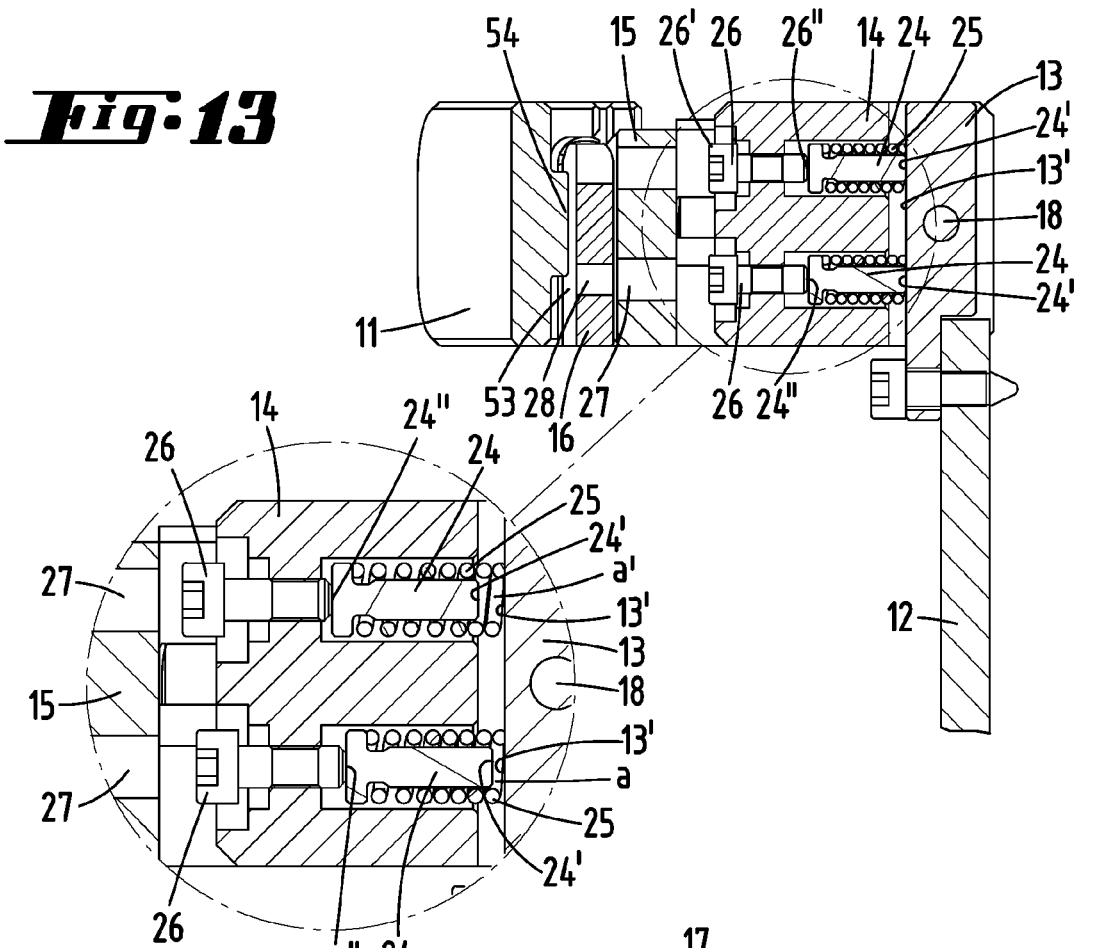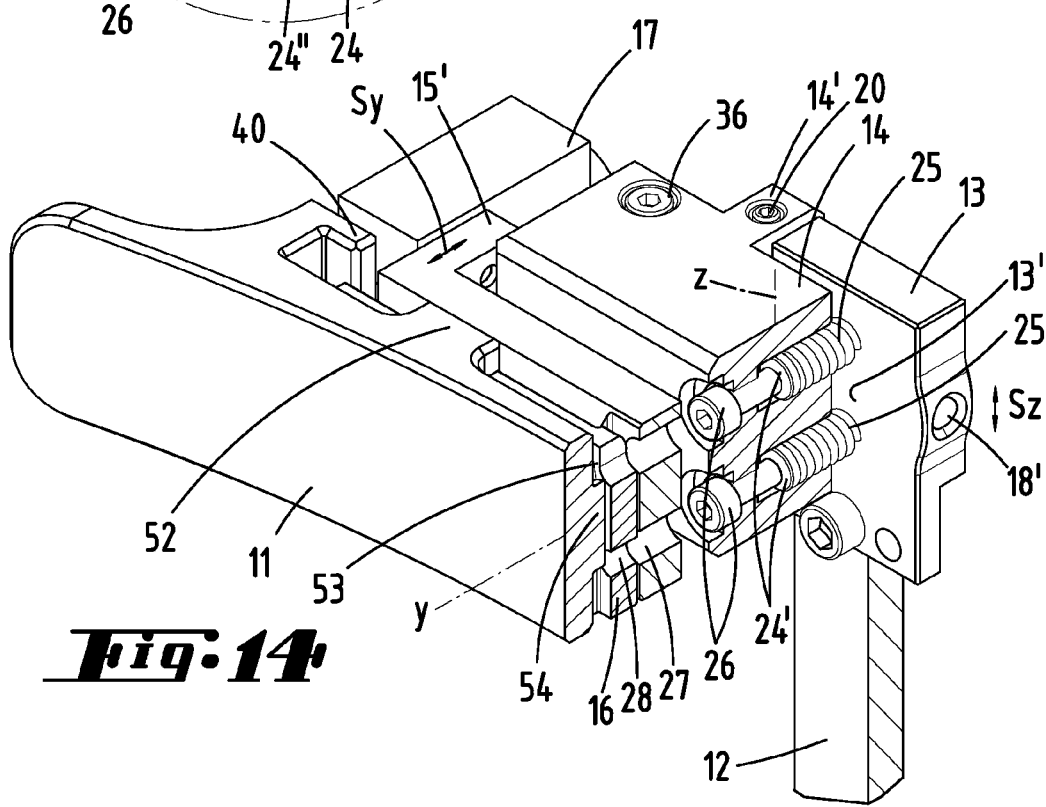

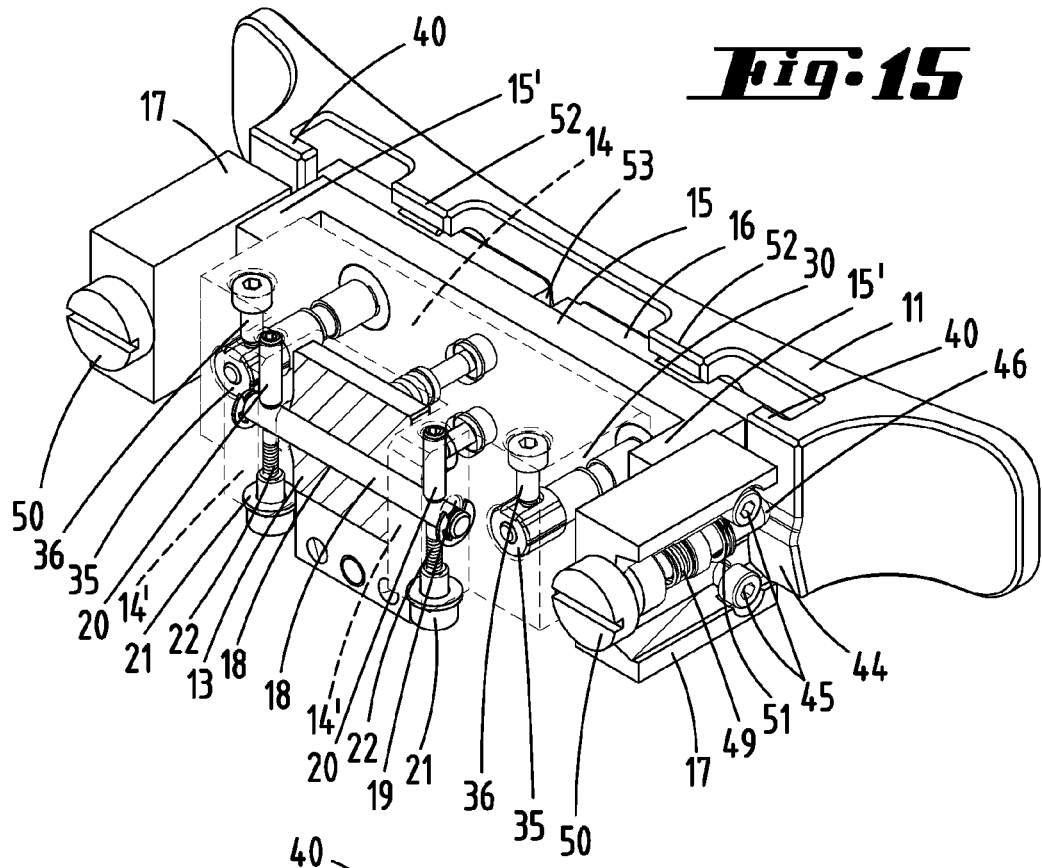
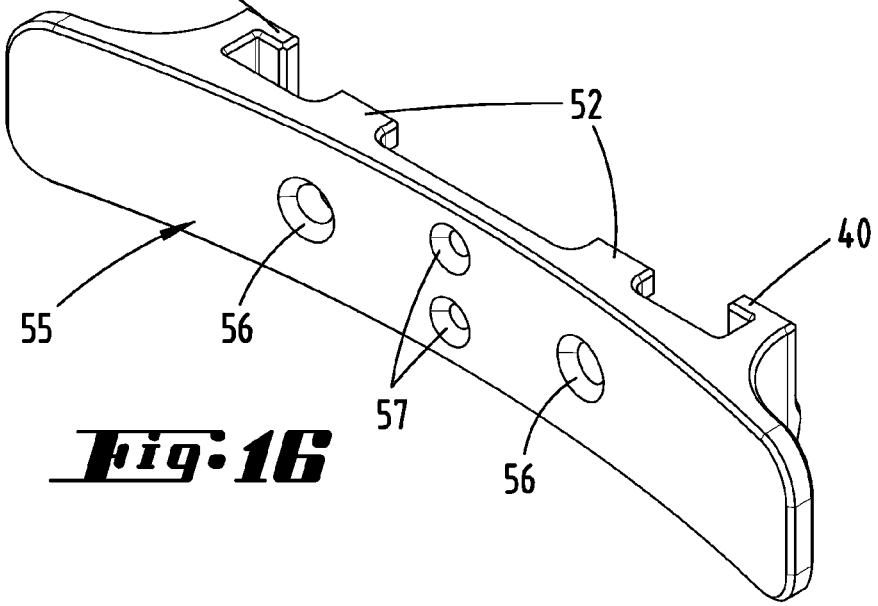

CLOSURE ELEMENT FOR CLOSING A LOADING OPENING OF AN INNER HOUSING OF A CVD REACTOR

FIELD OF TECHNOLOGY

The invention relates to a CVD reactor with a gastight and evacuable reactor housing and an inner housing arranged therein, which has means for feeding in a process gas and means for holding a substrate to be treated in the inner housing by means of the process gases, wherein the inner housing has a loading opening that can be closed off by a sealing element of a closure element, and the sealing element, in its closure position, abuts with an encircling sealing zone against a counter-sealing zone which encircles the loading opening on the outer side of the inner housing.

PRIOR ART

Known from US 2013/0101372 A1 is a CVD reactor, in which a processing chamber incorporating a gas inlet member and a substrate-carrying susceptor is shielded away from the space surrounding the processing chamber with a housing. The housing has a loading opening that can be closed with a closure element.

Previously known from U.S. Pat. No. 6,273,664 B1 is a pivotable closure element of a processing chamber.

DE 10 2014 106 467 A1 discloses a closure element with a sealing element, which can be fastened to a carrier so as to be pivotable around a pivot axis.

Coating steps are performed in a CVD reactor, in particular an MOCVD reactor. For example, substrates comprised of silicon or a III-V compound are coated with one or several layers in the processing chamber of the CVD reactor. The substrate is preferably a monocrystalline solid, on the surface of which one or several, in particular III-V layers, are deposited in a monocrystalline manner. To this end, the susceptor that carries the substrate is heated to a process temperature. The process temperatures can lie within a range of between 1000° C. and 1200° C., wherein the high temperatures are reached in particular during the deposition of nitrides. In this process, metalloorganic compounds, in particular of elements in the III primary group, are fed into the processing chamber as process gases. The elements in the V primary group are fed into the processing chamber as hydrides. For example, nitrogen is fed into the processing chamber as $NH_3$. During deposition, the gaseous source materials break down in the gas phase over the substrate and on the surface of the substrate. Parasitic coatings arise both on the surface of the susceptor and on the surface of a wall surrounding the processing chamber. These must be removed from time to time. The parasitic coatings can be removed via dry etching. To this end, an etching gas is fed into the processing chamber. At elevated temperatures, the parasitic coatings are converted by means of the etching gas into volatile products, which can be removed from the processing chamber by means of a carrier gas. $Cl_2$ or another halogen compound or another halogen can be used as the etching gas. HCl can also be used.

SUMMARY OF THE INVENTION

The object of the invention is to indicate measures by which the etching effect of the cleaning gas can be limited only to the area of the processing chamber.

The object is achieved by the invention indicated in the claims, wherein the subclaims not only describe advantageous further developments of the invention indicated in claim 1, but also standalone solutions to the object. Individual features in the subclaims can be combined as desired with individual features in other subclaims.

It is initially and essentially proposed that the processing chamber be encapsulated by an inner housing arranged in the reactor housing. The inner housing has a loading opening, which can be closed off by a sealing element of a closure element. The sealing element has a sealing surface and a sealing zone that surrounds the sealing surface. In a closure position in which the sealing element closes off the loading opening, the sealing zone abuts against a counter-sealing zone of the inner housing. The counter-sealing zone is comprised of an edge area of the loading opening. The counter-sealing zone is comprised of the surface of the wall of the inner housing that is directed outwardly, meaning in the area surrounding the processing chamber. In the closure position, the sealing element outwardly abuts against the counter-sealing zone. It is held by a carrier, which can be displaced by mechanical drive means in such a way as to bring the sealing element from the closure position into an open position. The sealing element here moves away from the loading opening, so that the latter is free for loading and unloading the processing chamber. The carrier and sealing element are arranged in the area of the reactor housing that surrounds the processing chamber, i.e., the inner housing. A vacuum pump is provided, with which the reactor housing and processing chamber can be evacuated. In particular given an equalized pressure on both sides of the sealing element, the sealing element closes off the loading opening gastight.

Another aspect of the invention involves increasing the tightness of the sealing element in the closure position. To this end, it is provided in particular that the sealing element and at least one spatial axis be pivotably fastened to the carrier. Spatial axes are understood as the X, Y and Z axes, which are perpendicular to each other, and indicate the three spatial axes. In particular, it is provided that a Y-axis be directed toward the loading direction through the loading opening. In particular, it is provided that the inner housing has a cylindrical lateral wall. This cylindrical lateral wall comprises the loading opening, so that the counter-sealing zones are curved. In such a configuration of the inner housing, the sealing element can have a sealing surface that comprises an inner cylindrical lateral wall surface. The Z-axis is preferably the axis that defines the cylinder of the inner housing. However, the loading opening can also be arranged in a flat lateral wall. Provided to increase the sealing effect is a fastener assembly, which has one or several elastic elements. According to the invention, the sealing element is carried by a carrier so as to be elastically deflectable in at least one spatial direction. The sealing element can take the form of a sealing plate. The latter has an extension surface that can be curved. The displacement direction is preferably the direction of a surface normal of a tangent surface in the center surface of the sealing element. The fastener assembly can be provided in pairs. The at least one, preferably two, fastener assemblies each have an elastic element that exerts a sealing force in the closure position. The sealing force presses the sealing zone flatly against the counter-sealing zone. The first elastic element thus preferably acts in the direction of the Y-axis. A second elastic element can be provided, which exerts a spring effect that opposes the spring effect of the first elastic element. Both elastic elements can be arranged axially one after the other in the direction of the Y-axis, and hold the sealing element in a central, neutral position cushioned on both sides. In the central, neutral position, the first force applied by a pre-stressed, first elastic element to the sealing element corresponds to a second force applied by the second elastic element to the sealing element. The two forces oppose each other, so as to hold the sealing element in the central, neutral position. As the inner housing expands or the sealing element approaches the inner housing, a sealing force arises, or a sealing force increases. The force generated by the first elastic element here increases. The force generated by the second elastic element diminishes. Both elastic elements preferably have the same spring characteristic, i.e., the same spring stiffness. The preferably two fastener assemblies are arranged offset relative to each other in the direction of the X-axis, and act in parallel in the direction of the Y-axis. The fastener assembly can have a head and a shaft. The shaft can be designed as a threaded shaft. A retainer can be provided, to which the head is fastened. In particular, the head abuts against a contact surface. The retainer is provided in particular for retaining the sealing element. A mounting hole can be provided, through which the shaft is inserted. The fastener assembly can be secured to a joint body, wherein this joint body can be adjusted relative to the carrier, preferably by at least one spatial axis. The mounting hole can connect two contact surfaces facing away from each other. The contact surfaces can be comprised of support surfaces, and are preferably formed by edges of the mounting hole. The elastic elements can be supported on these edges. The first elastic element can support itself on a first support surface on the one side of the mounting hole, and the second elastic element on a second support surface on the other side of the mounting hole. In addition, the first elastic element is preferably also supported on the retainer, so that it is compressed when the retainer gets displaced in the direction toward the joint body. The second elastic element can additionally be supported on a body fixedly connected with the shaft, wherein this body is secured to the shaft on the side lying opposite the head. The body can be a sliding sleeve, which is movably arranged in a guide of the joint body.

A further development of the invention provides that a head of the carrier have a bearing hole, which extends in the X-direction. Mounted in this bearing hole is a bearing axis, which protrudes from the bearing hole with its two ends facing away from each other. The joint body is borne by the bearing axis, in particular with the two ends of the bearing axis facing away from each other, so that the joint body can be pivoted around the X-axis. Pivot limiting means are preferably provided to limit the pivot angle of the joint body around the X-axis. The pivot limiting means can have adjusting means or be comprised of adjusting means. These adjusting means can have an adjusting screw. However, they can also have spring elements, so that the joint body can be not just limited by a stop, but also exposed to a spring force, as it pivots from an adjustable, central neutral position around the X-axis. The latter or other adjusting means can engage at the two ends of the bearing axis protruding from the bearing hole. An adjusting screw can here be involved. The adjusting screw can be radially adjusted in relation to the bearing axis. This makes it possible to adjust the joint body in the direction of the Z-axis. Since the two adjusting points are offset from each other in relation to the Y-axis, the two adjusting screws can also be used to set the angle of inclination of the joint body relative to the Y-axis. It is especially preferably provided that an elastic pressure element be spatially allocated to the adjusting screw, wherein the elastically acting pressure element lies diametrically opposite the adjusting screw in relation to the bearing axis.

The elastic pressure element can have a pressure screw that acts on a spring element, which is supported on the bearing axis on the opposing side of the adjusting screw. The adjusting means for linearly adjusting the joint body in the direction of the Z-axis or for adjusting the angle of inclination of the joint body in relation to the Y-axis can be allocated to legs of the joint body, wherein the carrier head of the carrier is arranged between the legs. The joint body is additionally the carrier of a retainer. The retainer can be elastically displaced in the direction of the Y-axis relative to the joint body by means of the fastener assembly. Since two fastener assemblies are provided, which in relation to the Y-axis are each spaced apart in the X-direction from the Y-axis, the inclination of the retainer around the Z-axis can be adjusted by varying linear displacements of the fastener assemblies in the Y-direction.

A further development of the invention provides that the sealing element can be plugged onto the retainer or an intermediate carrier retained by the retainer. The sealing element preferably consists of a material that is resistant to high temperatures, for example a coated graphite. The joint body and retainer can consist of a metal. The intermediate carrier fixedly connected with the retainer can be an insulating body that thermally insulates the retainer against the sealing element. A latching connection can be provided, with which the sealing element is secured to the carrier or retaining device. To this end, the sealing element can have a run-on slope with a latching projection. The run-on slope is preferably located on the side of the sealing element facing away from the sealing surface. The retainer or a bracket secured to the retainer can have a spring-loaded latching pin, the latching head of which slides along the run-on slope and runs over the latching projection while plugging the sealing element onto the intermediate carrier. The sealing element is plugged onto the intermediate carrier in the direction of the Z-axis, i.e., in a tangential direction relative to the sealing surface.

A further development of the invention provides that at least several of the adjusting means can be adjusted via an adjusting tool, for example a screwdriver. The adjustment can be made from the side of the retainer or intermediate carrier that is normally covered by the sealing element. To allow an adjustment of the adjusting means, the sealing element can be replaced with an essentially structurally identical adjusting element, which has screwdriver passage openings through which the adjusting tools can engage, so as to adjust the inclined position of the joint body or retainer, or to tension or relax the spring elements.

BRIEF DESCRIPTION OF THE DRAWINGS

An exemplary embodiment of the invention will be explained below based on the attached drawings. Shown on:

FIG. 4 is a perspective view of the closure element 10, partially broken open, FIG. 5a is a first exploded view of the essential elements of the closure element 10, FIG. 5b is a second exploded view of the essential elements of the closure element 10, FIG. 6 is a top view of the closure element, FIG. 7 is the section along the VII-VII line on FIG. 6, FIG. 8 is a rearward, partially broken open view of the closure element 10, FIG. 9 is the section along the IX-IX line on FIG. 6, FIG. 10 is a view of the closure element 10, partially broken open, FIG. 11 is the section along the XI-XI line on FIG. 6, FIG. 12 is a view according to FIG. 10, but broken up differently, wherein the sealing element 11 is only denoted with dashed lines, FIG. 13 is the section along the XIII-XIII line on FIG. 6, FIG. 14 is a view according to FIG. 10, but broken up differently, FIG. 15 is the view according to FIG. 8, but with a joint body 14 shown with dashed lines, and FIG. 16 is an adjusting element 15, which can be replaced with a sealing element 11.

DESCRIPTION OF THE EMBODIMENTS

Figure 1:
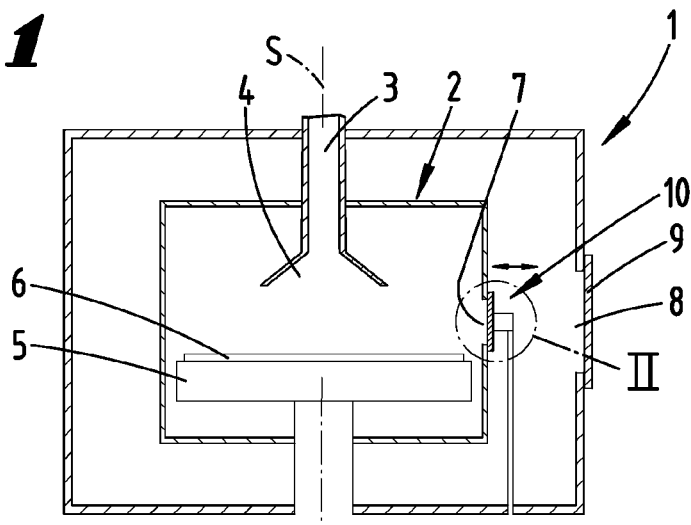
FIG. 1 is a schematic construction of an MOCVD reactor.

FIG. 1 presents a schematic view of the construction of an MOCVD reactor, which has a gastight reactor housing 1 that contains a loading opening 8, which can be closed by a door 9. An atmospheric pressure is present outside of the door 9. An adjustable sub-atmospheric pressure can prevail inside of the reactor housing 1. To this end, a vacuum pump is provided (not shown in the drawings).

Located inside of the reactor housing 1 is an inner housing 2, which seals the processing chamber located in the inner housing gastight against the environment of the inner housing 2. Located inside of the inner housing 2 is a gas inlet member 4 for introducing process gases, which are supplied from outside via a gas supply line 3. Also located inside of the processing chamber is a heatable susceptor 5, which carries the substrate to be coated.

Figure 2:
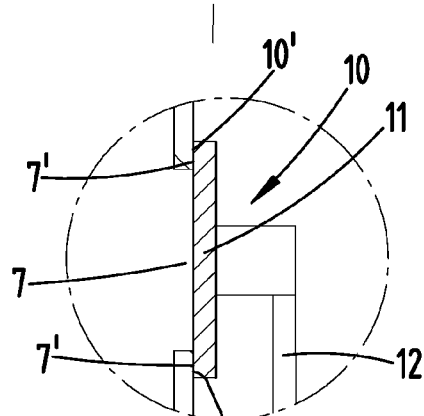
FIG. 2 is the cutout II on FIG. 1.
Figure 3:
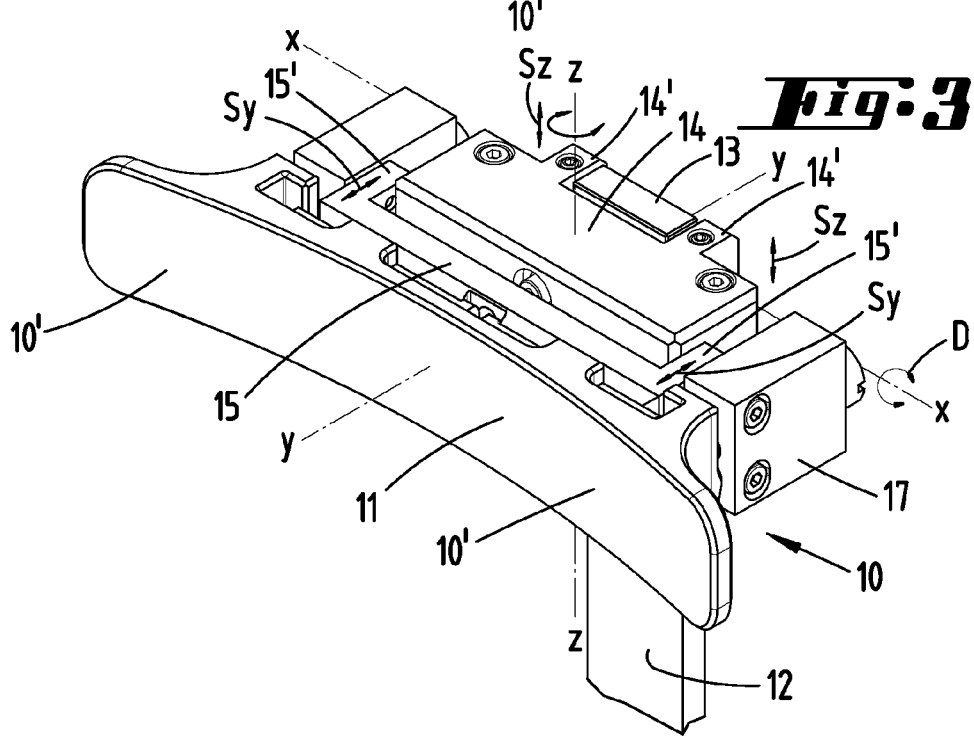
FIG. 3 is a perspective view of a closure element 10, which has a sealing element 11 that is secured to a carrier 12 and can be used to close off a loading opening 7 of an inner housing 2.

FIG. 2 shows a magnified view of a loading opening 7 in a cylindrical wall of the inner housing 2. The loading opening 7 is surrounded by a counter-sealing zone 7' on the outwardly facing side of the inner housing 2. A sealing zone 10' of a sealing element 11 of a closure element 10 abuts against this counter-sealing zone 7' in a closure position. The sealing connection 10', 7 is essentially gastight at least when the pressure prevailing in the inner housing 2 is the same as the one prevailing in the volume of the reactor housing 1 surrounding the inner housing 2. S denotes an axis of symmetry, which runs through the gas inlet member 4 and the center of the susceptor 5. The inner housing 2 forms a cylindrical lateral wall around this axis of symmetry S, in which the loading opening 7 is arranged.

The sealing element 11 is carried by a carrier 12. The carrier 12 can be adjusted between two positions with a mechanical retaining device (not shown) inside of the reactor housing 1. In a closure position, the sealing element 11 closes off the loading opening 7. In an open position, the loading opening 7 is open with a substrate 6 for loading or unloading the susceptor 5. A gripper (not shown) or the like can engage through the flush loading openings 7, 8 once the closure element 10 and door 9 have assumed their respective open positions. In the opening process, the closure element 10 and in particular a sealing element 11 formed by the closure element 10 is removed from the axis of symmetry S.

The carrier 12 has a carrier head 13, which has a bearing hole. The bearing hole 18' extends in an X-direction. A bearing axis 18 that forms a bearing shaft is inserted in the bearing hole 18'. The bearing axis 18 has two free ends, which each protrude out of an end section of the bearing hole 18'. Each of the two ends of the bearing axis 18 is inserted into an oblong opening of a leg 14' of a joint body 14. As shown on FIG. 7, adjustable retaining elements arranged in the legs 14' engage onto the free ends of the bearing axis 18. An adjusting screw 20 is inserted into a hole formed transverse to the X-axis, in the exemplary embodiment in the direction of the Z-axis. Involved in this case is a grub screw, whose free end of the shaft abuts against the bearing axis 18. By adjusting the adjusting screw 20, the bearing point can be adjusted in a direction Sz toward the Z-axis. A spring element 22 is inserted into a hole that aligns with the hole in which the adjusting screw 20 is inserted, and is acted upon by a pressure screw 21. The spring element 22 is supported on the bearing axis 18 on the side lying opposite the adjusting screw 20. The adjusting screw 20 or the pressure screw 21 can be adjusted in the direction of the Z-axis. Adjusting the adjusting screw 20 makes it possible to adjust the location of the end section of the bearing axis 18 in the oblong hole 19 of the leg 14', and hence the position of the joint body 14 at two differing points in the Z-direction. The angle of inclination around the Y-axis can be adjusted by varyingly enlarging or reducing the adjusting paths Sz.

Situated roughly centrally in the joint body 14 are two adjusting elements 24, 26 shown on FIGS. 13 and 14, which can be used to adjust a pivoting motion of the joint body 14 around the X-axis. A stop plunger 24 has a stop end 24', which can support itself on the carrier head 13. A spring element 25 designed as a helical pressure spring is supported at one end on a stop surface 13' of the carrier head 13, and at a second end on a pressure end 24" of the stop plunger 24. In addition, a shaft end 26" of a pressure screw 26 engages the pressure end 24", the head 26' of which has a screwdriver engaging opening, which can be used to adjust the pressure screw 26, and hence the distance of the stop end 24' from the stop surface 13'. The distances are denoted with a and a' on FIG. 13. The two spring elements 25 hold the joint body 14 in a central position. The joint body 14 can be pivoted out of this central position around the X-axis, until the stop ends 24' contact the stop surface 13'.

FIG. 14 additionally shows holes 27 in the retainer 15 and holes 28 in an intermediate carrier 16 carried by the retainer. A screwdriver can be inserted through the holes 27, 28, so as to adjust the pressure screws 26.

The retainer 15 can be linearly displaced in the Y-direction relative to the joint body 14. Two spring or fastener assemblies 30 offset parallel to each other in the XY-plane are provided for this purpose. The spring or fastener assemblies 30 extend in the Y-axis. Each of the spring or fastener assemblies 30 has a shaft 31", with which the retainer 15 is pivotably connected with the joint body 14. A head 31' of the spring or fastener assembly 30 is supported on the retainer 15. The shaft 31" connected with the head 31' engages through a mounting hole 34 of the joint body 14. In the exemplary embodiment, the shaft 31" also engages through a mounting hole 32 of the retainer 15, wherein a respective plate 33, 33' is provided on both sides of the mounting hole 32. A first elastic element 38 is supported on the plate 33' or on the retainer, and can be a rubber buffer or a helical pressure spring. The elastic element 38 is further supported on the joint body 14. In the exemplary embodiment, the first elastic element 38 is supported on an edge of the mounting hole 34 that faces the retainer 15. The edge of the mounting hole 34 lying opposite this edge forms a support surface, on which a second elastic elements 39 is supported, which is counter-mounted on the other side by a sliding sleeve 35. The sliding sleeve 35 can have a female thread, into which the male thread of the shaft 31" is screwed. The head 31' and the shaft 31" can be comprised of one screw 31.

The sliding sleeve 35 can slide in the direction of the Y-axis in a bearing recess 37 of the joint body 14. A guide screw 36 is provided for rotationally securing the sliding sleeve 35, and engages into a recess in the sliding sleeve 35.

As a result of the two elastic elements 38,39 acting in opposite directions, the sealing element 11, its retainer 15 and/or the sliding sleeve 35 are floatingly mounted relative to the joint body 14. Therefore, the invention also relates to a sealing element 11 floatingly mounted relative to the carrier 12, which can be displaced in a sealing direction from an adjustable, central position against the elastic restoring force of one respective element 38, 39 acting on the carrier 12, wherein the sealing direction in particular is a radial direction on the S axis on FIG. 1. A preferred further development provides a twofold floating mount, so that the sealing element 10 can also swivel slightly in a plane in which the sealing direction runs.

The head 31' has a screwdriver engaging opening, with which the screw 31 can be turned. This either enlarges or reduces the stress of the elastic elements 38, 39. Turning the screw 31 makes it possible to linearly displace the retainer 15 in direction Sy at two different points. By varyingly adjusting the retainer 15 by means of the two fastener assemblies 30, the inclined position of the retainer 15 around the Z-axis can be adjusted. Involved here is a bilaterally cushioned, floating mount of the retainer 15 relative to the joint body 14. The first elastic element 38 can be tensioned with the sealing element 11 in the end phase of closing the loading opening 7, so that it exerts a sealing force with which the sealing zone 10' abuts against the counter-sealing zone 7'.

The intermediate carrier 16 is fabricated out of a thermally insulating material, and fixedly connected with the retainer 15. Two brackets 17 are likewise fixedly connected with the retainer 15. To this end, the brackets 17 are screwed onto the leg 15' of the retainer 15.

Located inside of the brackets 17 are the latching means depicted on FIG. 9, with which the sealing element 11 plugged onto the intermediate carrier 16 is kept in a latching connection. Fastening elements 40 of the sealing element 11 here engage into respective fastening niches 41 disposed between respective end portions 16' of the intermediate carrier 16 and each of the brackets 17, wherein each of the fastening elements 40 forms a run-on slope 44 and a latching projection 43 adjacent thereto. Located inside of the bracket 17 is a mounting hole 48, which forms a guide section 48'. A piston section 47 of a latching pin 46 can be displaced in the guide section 48'. The latching pin 46 forms a latching head 46', which rearwardly engages the latching projection 43 in the latching position. The piston section 47 is acted upon by a spring element 49, which is supported on a pressure screw 50.

The intermediate carrier 16 forms a stop zone 42 in the form of a lug, on which the fastening element 40 can be supported, wherein the stop zone 42 lies opposite the latching pin 46.

A stop extension 52 is provided, which is allocated to the sealing element 11 and can be supported on the intermediate carrier 16.

The sealing element 11 has a closed sealing surface that is surrounded by the sealing zone 10'.

An adjusting element 55 that can be exchanged for the sealing element 11 and is otherwise structurally identical to the sealing element 11 has screwdriver insertion openings 56, 57, which align flush with mounting holes that can be used to adjust the adjusting screws 26 and 31. The adjusting element 55 is used instead of the sealing element 11 for adjusting the different inclination angles or inclination angle limitations.

The sealing element 11 has a centering rib 54 on the side of the sealing element 11 facing away from the sealing surface. The centering rib 54 engages into a centering recess 53, which is arranged in about the middle of the retainer 15.

The above statements serve to explain the inventions encompassed by the application as a whole, which further develop the prior art at least by the following feature combinations, even taken separately, wherein two, several or all of these feature combinations can also be combined, specifically:

A CVD reactor, characterized in that the sealing element 11 is fastened to a carrier 12 so that it can be adjusted in terms of inclination and/or pivoted around at least one spatial axis X, Y, Z and/or elastically deflected in the direction of one of the spatial axes X, Y, Z.

A CVD reactor, characterized in that the sealing element 11 is fastened to the carrier 12 so that it can be at least adjusted in terms of inclination and/or pivoted around at least two spatial axes X, Y, Z and/or around the three spatial axes X, Y, Z.

A CVD reactor, characterized by at least one first elastic element 38 of a spring and/or fastener assembly 30, which in the closure position exerts a sealing force that presses the sealing zone 10' flatly against the counter-sealing zone 7'.

A CVD reactor, characterized in that the sealing force is the sum of a first force generated by the first elastic element 38 and a second force generated by a second elastic element 39, wherein the first force is directed opposite the second force, and both elastic elements 38, 39 are prestressed against each other in a neutral position.

A CVD reactor, characterized in that the loading opening 7 is arranged in a curved section of the inner housing 2, and the sealing element 11 has a curved sealing surface, the edge of which forms the sealing zone 10' and/or that the loading opening 7 is allocated to a cylindrical wall of the inner housing 2, wherein the carrier 12 can be displaced in a plane on which the contour axis of the cylindrical housing wall is perpendicular.

A CVD reactor, characterized in that the spring and/or fastener assembly 30 has a second elastic element 39, whose spring direction is directed opposite the spring direction of the first elastic element 38.

A CVD reactor, characterized in that the spring and/or fastener assembly 30 has a head 31' and a shaft 31", wherein the head 31' is secured to a retainer 15, and the shaft 31" is inserted in a mounting hole 34 of a joint head 14, and the elastic elements 38, 39 are supported on support surfaces 34', 34" that face away from each other and consist in particular of edges of the mounting hole 34, wherein it is provided in particular that the first elastic element 38 is supported on the retainer 15, and the second elastic element 39 is supported on the shaft 31", and in particular on a body connected with the shaft 31", for example a sliding sleeve 35.

A CVD reactor, characterized by a bearing axis 18, with which the closure element 10 can be pivoted around an X-axis.

A CVD reactor, characterized by pivot limiting means 24, 25, with which the pivot angle of the closure element 10 around the X-axis can be limited, and/or with which the closure element 10 can be fixed in an initial position in an elastically adjustable manner.

A CVD reactor, characterized by adjusting means 20 for adjusting an inclined position of the closure element 10 around the Y-axis, wherein it is provided in particular that the adjusting means 20 be adjusting screws that are supported on end sections of the bearing axis 18.

A CVD reactor, characterized in that elastic pressure elements formed by a pressure screw 21, and a spring element 22 are spatially allocated to the adjusting means 20, wherein it is provided in particular that the elements pressure screw 21, and the spring element 22 lie opposite the adjusting means 20 relative to the bearing axis 18, and permit an elastic adjustment of the inclined position of the closure element 10 around the Y-axis.

A CVD reactor, characterized in that the spring and/or fastener assembly 30 makes it possible to adjust the inclination of the closure element 10 around the Z-axis, and/or that the sealing element 11 is floatingly mounted in a sealing direction relative to the carrier 12.

A CVD reactor, characterized in that the sealing element 11 is connected with the intermediate carrier 16 via a detachable connection 43, 44, 46, wherein it is provided in particular that the intermediate carrier 16 is an insulating body and connected with a retainer 15, which can be pivoted relative to the carrier 12 around the at least one spatial axis X, Y, Z.

A CVD reactor, characterized in that the sealing element 11 can be exchanged for an essentially structurally identical adjusting element 55, wherein the adjusting element 55 has screwdriver insertion openings 56, 57 for activating adjusting screws, with which the inclined position of an intermediate carrier 16 and/or of a retainer 15 can be adjusted relative to the carrier 12.

All disclosed features (whether taken separately or in combination with each other) are essential to the invention. The disclosure of the application hereby also incorporates the accompanying/attached priority documents (copy of the previous application) in their entirety, also for the purpose of including features of these documents in the claims of the present application. Even without the features of a referenced claim, the subclaims with their features characterize independent inventive further developments of prior art, in particular so as to generate partial applications based upon these claims. The invention indicated in each claim can additionally have one or several of the features indicated in the above description, in particular those provided with reference numbers and/or enumerated in the reference list. The invention also relates to forms of design in which some of the features mentioned in the above description are not realized, in particular insofar as they are obviously not required for the respective intended purpose or can be replaced by other technically equivalent means.

REFERENCE LIST

| | |
|---|---|
| 1 | Reactor housing |
| 2 | Inner housing |
| 3 | Gas supply line |
| 4 | Gas inlet member |
| 5 | Susceptor |
| 6 | Substrate |
| 7 | Loading opening |
| 7' | Counter-sealing zone |
| 8 | Loading opening |
| 9 | Door |
| 10 | Closure element |
| 10' | Sealing zone |
| 11 | Sealing element |
| 12 | Carrier |
| 13 | Carrier head |
| 13' | Contact surface |
| 14 | Joint body |
| 14' | Leg |
| 15 | Retainer |
| 15' | Leg |
| 16 | Intermediate carrier/insulating body |
| 17 | Bracket |
| 18 | Bearing axis |
| 18' | Mounting hole |
| 19 | Oblong hole |
| 20 | Adjusting screw |
| 21 | Pressure screw |
| 22 | Spring element |
| 23 | Pressure pin |
| 24 | Stop plunger |
| 24' | Stop end |
| 24" | Pressure end |
| 25 | Spring element |
| 26 | Pressure screw |
| 26' | Head |
| 26" | Shaft end |
| 27 | Hole |
| 28 | Hole |
| 29 | Fastening screw |
| 30 | Fastener assembly |
| 31 | Screw |
| 31' | Head |
| 31" | Shaft |
| 32 | Mounting hole |
| 33 | Shoulder |
| 33' | Plate |
| 34 | Mounting hole |
| 34' | Support surfaces |
| 35 | Support surfaces |
| 35' | Guide groove |
| 36 | Sliding sleeve |
| 37 | Bearing recess |
| 38 | First elastic element |
| 39 | Second elastic element |
| 40 | Fastening web |
| 41 | Fastening niche |
| 42 | Stop zone |
| 43 | Latching projection |
| 44 | Run-on slope |
| 45 | Fastening shoulder |
| 46 | Latching pin |
| 46' | Latching head |
| 47 | Piston section |
| 48 | Mounting hole |
| 48' | Guide section |
| 49 | Spring element |
| 50 | Pressure screw |
| 51 | Spring element |
| 52 | Stop extension |
| 53 | Centering recess |
| 54 | Centering rib |
| 55 | Adjusting element |
| 56 | Screwdriver insertion opening |
| D | Rotational motion |
| S | Axis of symmetry |
| Sy | Adjusting path |
| Sz | Adjusting path |
| X | Axis |
| Y | Axis |
| Z | Axis |

The invention claimed is:

1. A chemical vapor deposition (CVD) reactor, comprising:
   a gastight and evacuable reactor housing (1);
   an inner housing (2) arranged within the reactor housing (1);
   means (3, 4) for feeding a process gas into the inner housing (2);
   means (5) for holding a substrate (6) to be treated in the inner housing (2) by means of the process gas;
   a closure element (10) comprising:

a first bracket (17) with a first spring-loaded latching pin (46), wherein a head (46') of the first spring-loaded latching pin (46) protrudes out of a mounting hole (48) of the first bracket (17);

a second bracket (17) with a second spring-loaded latching pin (46), wherein a head (46') of the second spring-loaded latching pin (46) protrudes out of a mounting hole (48) of the second bracket (17);

a retainer (15) disposed between the first bracket (17) and second bracket (17), wherein the first and second brackets (17) are fixedly connected to the retainer (15);

an intermediate carrier (16) fixedly connected to the retainer (15), wherein the intermediate carrier (16) comprises a first end portion (16') and a second end portion (16');

a sealing element (11) with a first fastening element (40) and a second fastening element (40), wherein a first surface of the first fastening element (40) comprises a first latching projection (43) that contacts the head (46') of the first spring-loaded latching pin (46) and a second surface of the first fastening element (40) faces away from the first spring-loaded latching pin (46) and faces towards the first end portion (16') of the intermediate carrier (16), wherein a first surface of the second fastening element (40) comprises a second latching projection (43) that contacts the head (46') of the second spring-loaded latching pin (46) and a second surface of the second fastening element (40) faces away from the second spring-loaded latching pin (46) and faces towards the second end portion (16') of the intermediate carrier (16), wherein the sealing element (11) is configured to, when disposed in a closure position, seal a loading opening (7) of the inner housing (2), wherein when the sealing element (11) is disposed in the closure position, an encircling sealing zone (10') of the sealing element (11) abuts against a counter-sealing zone (7') which encircles the loading opening (7) on an outer side of the inner housing (2), a joint body (14);

a fastener assembly (30) that comprises:

a first elastic element (38) that generates a first force in a first direction; and a second elastic element (39) that generates a second force in a second direction opposite to the first direction, wherein the fastener assembly (30) fastens the retainer (15) to the joint body (14) so that the sealing element (11) is elastically deflectable in a direction of one of a plurality of spatial axes (X, Y, Z); and a carrier (12) configured to carry the closure element (10), wherein when the sealing element (11) is disposed in the closure position, the fastener assembly (30) exerts a sealing force that presses the sealing zone (10') flatly against the counter-sealing zone (7') in a sealing direction, wherein the sealing force is a sum of the first force generated by the first elastic element (38) and the second force generated by the second elastic element (39), and wherein the first and second elastic elements (38, 39), in a reciprocally prestressed neutral position, floatingly mount the sealing element (11) in the sealing direction relative to the carrier (12).

2. The CVD reactor of claim 1, wherein at least one of:
(i) the loading opening (7) is arranged in a curved section of the inner housing (2), and the sealing element (11) has a curved sealing surface, an edge of which forms the sealing zone (10'); or
(ii) the loading opening (7) passes through a cylindrical wall of the inner housing (2), wherein the carrier (12) is displaceable in a plane that is perpendicular to a contour axis of the cylindrical wall.

3. The CVD reactor of claim 1,
wherein the fastener assembly (30) further comprises a screw (31) with a head (31') and a shaft (31"),
wherein the head (31') is secured to the retainer (15), and the shaft (31") is inserted in a mounting hole (34) of the joint body (14), and
wherein the first and second elastic elements (38, 39) are supported on support surfaces (34', 34") that face away from each other and include edges of the mounting hole (34).

4. The CVD reactor of claim 3, wherein the first elastic element (38) is supported on the retainer (15), and the second elastic element (39) is supported on the shaft (31").

5. The CVD reactor of claim 3, wherein the first elastic element (38) is supported on the retainer (15), and the second elastic element (39) is supported on a body connected with the shaft (31").

6. The CVD reactor of claim 3, wherein the first elastic element (38) is supported on the retainer (15), and the second elastic element (39) is supported on a sliding sleeve (35) connected with the shaft (31").

7. The CVD reactor of claim 1, wherein the fastener assembly (30) is configured for adjusting an inclination of the closure element (10) around a vertically oriented Z-axis.

8. The CVD reactor of claim 1, wherein the intermediate carrier (16) is an insulating body, and wherein the retainer (15) is pivotable relative to the carrier (12) around at least one of the spatial axes (X, Y, Z).

9. The CVD reactor of claim 1, wherein the sealing element (11) is exchangeable with an adjusting element (55) with screwdriver insertion openings (56, 57) for activating adjusting screws, with which an inclined position of at least one of the intermediate carrier (16) or the retainer (15) is adjustable relative to the carrier (12).

* * * * *